US007763982B2

(12) United States Patent
Liao (10) Patent No.: US 7,763,982 B2
(45) Date of Patent: Jul. 27, 2010

(54) PACKAGE SUBSTRATE STRIP, METAL SURFACE TREATMENT METHOD THEREOF AND CHIP PACKAGE STRUCTURE

(75) Inventor: Guo-cheng Liao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 242 days.

(21) Appl. No.: 12/044,697

(22) Filed: Mar. 7, 2008

(65) Prior Publication Data
US 2008/0217758 A1 Sep. 11, 2008

(30) Foreign Application Priority Data
Mar. 9, 2007 (TW) ............................... 96108223 A (51) Int. Cl.
*H01L 23/48* (2006.01)

(52) U.S. Cl. .................. 257/777; 257/678; 257/700; 257/778; 257/E23.031; 174/260; 361/760

(58) Field of Classification Search .................. 257/678, 257/685, 686, 690, 692, 693, 691, 700, 738, 257/750, 758, 774, 777, 778, 779, 780, 781, 257/784, 786, E23.031; 174/260, 262, 257; 361/782, 760
See application file for complete search history.

(56) References Cited

U.S. PATENT DOCUMENTS

| 7,352,060 | B2* | 4/2008 | Shimizu et al. | 257/700 |
| 2006/0023439 | A1* | 2/2006 | Fraley et al. | 361/780 |
| 2007/0075435 | A1* | 4/2007 | Suminoe et al. | 257/777 |
| 2007/0194432 | A1* | 8/2007 | Hsu et al. | 257/698 |

* cited by examiner

*Primary Examiner*—Hoa B Trinh
(74) *Attorney, Agent, or Firm*—Morris, Manning & Martin LLP; Tim Tingkang Xia (57) ABSTRACT

A package substrate strip having a reserved plating bar and a metal surface treatment method thereof are provided. The metal surface treatment method forms a conductive layer connecting the reserved plating bar and bonding pads of the package substrate stripe and further forms an isolating layer covering the conductive layer. By original plating bars and the reserved plating bar, an anti-oxidation layer can be simultaneously formed on finger contacts, first ball pads electrically connected to the finger contacts, and second ball pads electrically connected to the bonding pads. The package substrate strip and the method for metal surface treatment thereof can simplify manufacturing process, reduce production cost, and improve production efficiency and yield. Furthermore, a chip package applying the package substrate strip is also provided.

16 Claims, 9 Drawing Sheets

PACKAGE SUBSTRATE STRIP, METAL SURFACE TREATMENT METHOD THEREOF AND CHIP PACKAGE STRUCTURE

BACKGROUND OF THE INVENTION

1. Field of the Invention

The present invention relates to a package substrate, and more particularly to a package substrate having a plating bar reserved therein for plating ball pads of the package substrate.

2. Description of the Prior Art

High efficiency, high integration, low cost and miniaturization are all performances desired in designing and manufacturing electrical products, for achieving said requirements, IC package technology also develops toward miniaturization and compactness. Besides familiar Ball Grid Array Package (BGA Package), Chip-Scale Package (CSP) and Flip Chip Package (F/C Package), for the sake of further incorporating multi-function chip modules, a stack package technology is recently provided to improve the whole package density via stacking several chips together.

For the sake of mounting different type of chips in one substrate, a hybrid substrate is a commonly used carrier in stacking package. Usually, the hybrid substrate has many different type of electrical contacts to provide suitable electrical connecting manners for different chips. Taking a hybrid substrate conjuncting a Surface Mount Technology (SMT, i.e. Flip Chip Bonding) and a wire bonding technology (W/B Technology) as an example, the hybrid substrate has both finger contacts for wire bonding and bonding pads for surface bonding. Furthermore, the hybrid substrate has a plurality of first ball pads for electrically connecting with said finger contacts and a plurality of second ball pads for electrically connecting with said bonding pads on the bottom, used to provide different signal transfer paths.

In a manufacture process of a conventional hybrid substrate, it not only needs to form an anti-oxidation layer on the finger contacts, but also needs to form a same anti-oxidation layer on the first ball pads and the second ball pads. However, the bonding pads need not to be plated to form an anti-oxidation layer, and the high density distribution of the bonding pads makes it difficult to dispose plating bars therebetween. Thus, when the second ball pads connected to said bonding pads do not connect with said plating bars, the second ball pads are unable to be simultaneously plated together with the finger contacts and the first ball pads. Therefore, it needs to perform additional anti-oxidation treatment or add more complex producing process, this will influence the production efficiency and manufacturing yield of the product.

BRIEF SUMMARY OF THE INVENTION

Therefore, to resolve the drawbacks of said conventional technology that not able to simultaneously plate at least two types of ball pads in a hybrid substrate, a primary object of the present invention is to provide a package substrate strip.

Another object of the present invention is to provide a metal surface treatment method of a package substrate strip, according to the structure of said package substrate strip, the method is capable of simultaneously plating all ball pads of a hybrid substrate to form an anti-oxidation layer thereon without forming any anti-oxidation layer on the surface of bonding pads, it's will benefit to simplify producing process.

A further object of the present invention is to provide a chip package structure, by applying said package substrate strip and said metal surface treatment method, it has a prefer production efficiency and manufacture yield.

To accomplish the above invention objects, the present invention provides a package substrate strip, which comprises at least a substrate unit. The substrate unit comprises a substrate, a plurality of bonding pads, a plurality of finger contacts, a plurality of plating bars, a reserved plating bar, a first patterned solder mask layer, a plurality of first ball pads, a plurality of second ball pads, a second patterned solder mask layer and an anti-oxidation layer. The substrate has a first surface and an opposite second surface, the bonding pads, finger contacts and plating bars are disposed on the first surface, and the plating bars correspondingly connects with the finger contacts and extends outside the substrate unit. Furthermore, the reserved plating bar is disposed on the first surface, extends out of the substrate unit from a position beside the bonding pads, and connects with the plating bars at outside of the substrate unit. The first patterned solder mask layer is disposed on the first surface and exposes the bonding pads, the finger contacts and a part of the reserved plating bar. The first ball pads and the second ball pads are disposed on the second surface and respectively electrically connect with the finger contacts and the bonding pads via the substrate. The second patterned solder mask layer is disposed on the second surface and exposes the first ball pads and the second ball pads. In addition, the anti-oxidation layer is disposed on the finger contacts, the first and second ball pads.

In an embodiment of the invention, said anti-oxidation layer of the substrate unit further includes a nickel/gold layer. In addition, the finger contacts of the substrate are preferably bonding wire contacts, the bonding pads of the substrate are preferably flip-chip bonding pads.

In an embodiment of the invention, said finger contacts of the substrate unit locates at the periphery area of the first surface. In addition, the bonding pads arrange as a grid array at the central area of the first surface.

In an embodiment of the invention, said substrate of the substrate unit includes a plurality of dielectric layers and at least one inner wiring layer, and the inner wiring layer is disposed between two neighbor dielectric layers.

The invention further provides a metal surface treatment method of a package substrate strip. Firstly, providing a semi-finished package substrate strip, the semi-finished package substrate strip has at least one substrate unit. The substrate unit comprises a substrate, a plurality of bonding pads, a plurality of finger contacts, a plurality of plating bars, a reserved plating bar, a first patterned solder mask layer, a plurality of first ball pads, a plurality of second ball pads and a second patterned solder mask layer. The substrate has a first surface and an opposite second surface. The bonding pads, finger contacts and plating bars are disposed on the first surface, and the plating bars correspondingly connects with the finger contacts and extends outside the substrate unit. The reserved plating bar is disposed on the first surface, extends out of the substrate unit from a position beside the bonding pads, and connects with the plating bars at outside of the substrate unit. The first patterned solder mask layer is disposed on the first surface and exposes the bonding pads, the finger contacts and a part of the reserved plating bar. The first ball pads and the second ball pads are disposed on the second surface and respectively electrically connect with the finger contacts and the bonding pads via the substrate. The second patterned solder mask layer is disposed on the second surface and exposes the first ball pads and the second ball pads. Next, forming a conductive layer on a part of the first surface for connecting a part of the reserved plating bar and bonding pads exposed by the first patterned solder mask layer, and the conductive layer exposes the finger contacts. Then, covering an isolating layer on the conductive layer. Next, utilizing the plating bars and the reserved plating bar to form an anti-oxidation layer on the finger contacts, the first ball pads and the second ball pads through an electroplating method. After that, removing the isolating layer and the conductive layer.

In an embodiment of the invention, the step of forming a conductive layer includes: firstly, disposing a mask above the first surface, the mask has an opening for exposing the bonding pads and a part of the reserved plating bar. Next, forming a conductive layer in the opening through a chemical plating method. Then, removing the mask. The mask is preferably a Dry Film Photoresist.

In an embodiment of the invention, said isolating layer is preferably another Dry Film Photoresist.

The invention also provides a chip package structure, which comprises a substrate, a plurality of bonding pads, a plurality of finger contacts, a reserved plating bar, a first patterned solder mask layer, a plurality of first ball pads, a plurality of second ball pads, a second patterned solder mask layer, an anti-oxidation layer, a first chip and a second chip. The substrate has a first surface and an opposite second surface. The bonding pads and finger contacts are disposed on the first surface. The reserved plating bar is disposed on the first surface and extends from an edge of the first surface to a position beside the bonding pads. The first patterned solder mask layer is disposed on the first surface and exposes the bonding pads, the finger contacts and a part of the reserved plating bar. The first ball pads and the second ball pads are disposed on the second surface and respectively electrically connect with the finger contacts and the bonding pads via the substrate. The second patterned solder mask layer is disposed on the second surface and exposes the first ball pads and the second ball pads. The anti-oxidation is disposed on the finger contacts, the first ball pads and the second ball pads. In addition, the first chip is disposed above the first surface and electrically connects with the bonding pads. The second chip is disposed on the first chip and electrically connects with the finger contacts.

In an embodiment of the invention, said anti-oxidation layer of the chip package structure includes a nickel/gold layer.

In an embodiment of the invention, said first chip of the chip package structure is electrically connected with the bonding pads via a plurality of conductive bumps through a flip-chip bonding method.

In an embodiment of the invention, said second chip of the chip package structure is electrically connected with the finger contacts via a plurality of wires through a wire bonding method.

In an embodiment of the invention, said finger contacts of the chip package structure locate at a periphery area of the first surface. In addition, the bonding pads of the chip package structure arranges as a grid array at a central area of the first surface.

In an embodiment of the invention, said substrate of the substrate unit includes a plurality of dielectric layers and at least one inner wiring layer, and the inner wiring layer is disposed between two neighbor dielectric layers.

In an embodiment of the invention, said chip package structure further includes a plurality of soldering balls, which are disposed on the first and second ball pads.

In an embodiment of the invention, said chip package structure further includes a package encapsulant, which is disposed on the first surface for packing the first chip, the second chip the finger contacts and the bonding pads.

According to the above disclosure, the invention provides a design having reserved plating bar and a metal surface treatment method thereof. The method is capable of simultaneously plating the finger contacts, the first ball pads that electrically connected with the finger contacts and the second ball pads that electrically connected with the bonding pads, therefore, it simplifies manufacturing process and reduces production cost, and it benefits to improve production efficiency and yield.

The advantages and novel features of the invention will become more apparent from the following detailed description of a preferred embodiment when taken in conjunction with the accompanying drawings.

BRIEF DESCRIPTION OF THE DRAWINGS

The present invention may best be understood through the following description with reference to the accompanying drawings, in which:

FIG. 2A to 8A illustrate a metal surface treatment process of an semi-finished package substrate strip in turn;

FIG. 2B to 8B respectively illustrate a sectional view taken along a dividing line A-A' of the package substrate strip shown in FIG. 2A to 8A;

DETAILED DESCRIPTION OF THE INVENTION

The invention provides a package substrate strip and a metal surface treatment method thereof, and a chip package structure applying said package substrate strip, so as to resolve the drawback in a prior art that not capable of simultaneously plating at least two types of ball pads of a hybrid substrate, and simplify producing process, improve production efficiency and manufacture yield. The following several embodiments exemplary describe part operation status and corresponding manufacture process of the invention. By any possibility, the same sign number in the figures of the following every different embodiments of the invention indicates the same or the similar element, while a repeat description will be ignored. Moreover, to avoid complicating the figures and emphasize the important section of the invention, the relative figures of the package substrate strip and the metal surface treatment method thereof only show one substrate unit of the package substrate strip. However, actually, the package substrate strip may comprise several substrate units disposed as a grid array, by a packing process, several conjoint chip packages are simultaneously formed, and after a formation process, several signal chip packages are obtained.

Figure 1A:
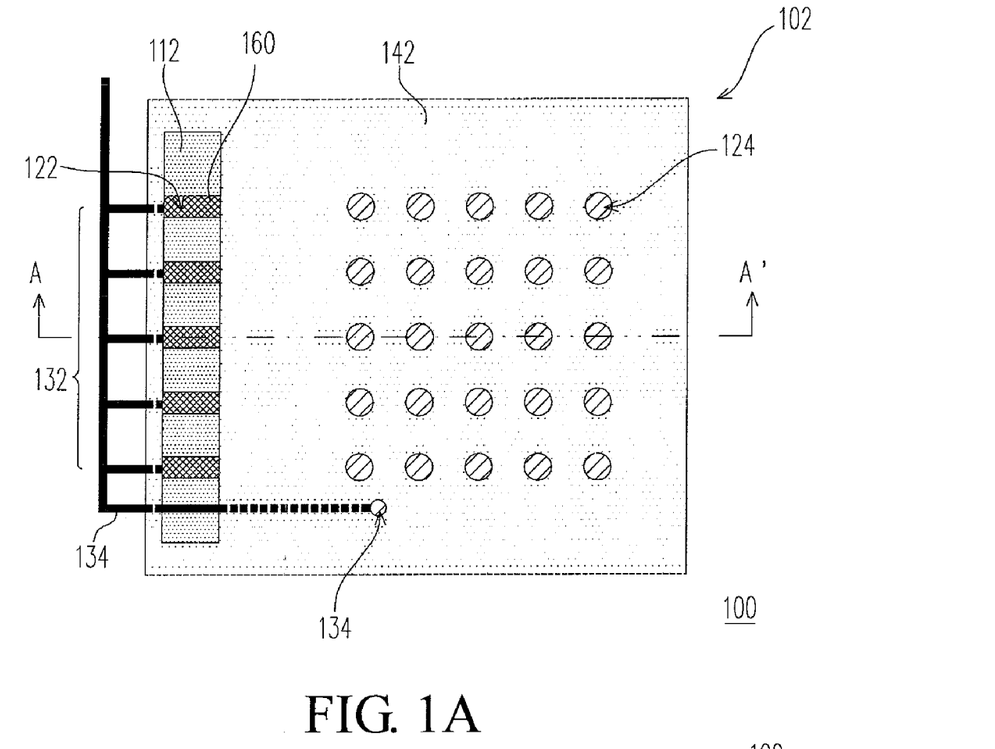
FIGS. 1A and 1B respectively illustrate a package substrate strip and a sectional view thereof taken along a dividing line A-A' according to an embodiment of the invention.
Figure 1B:
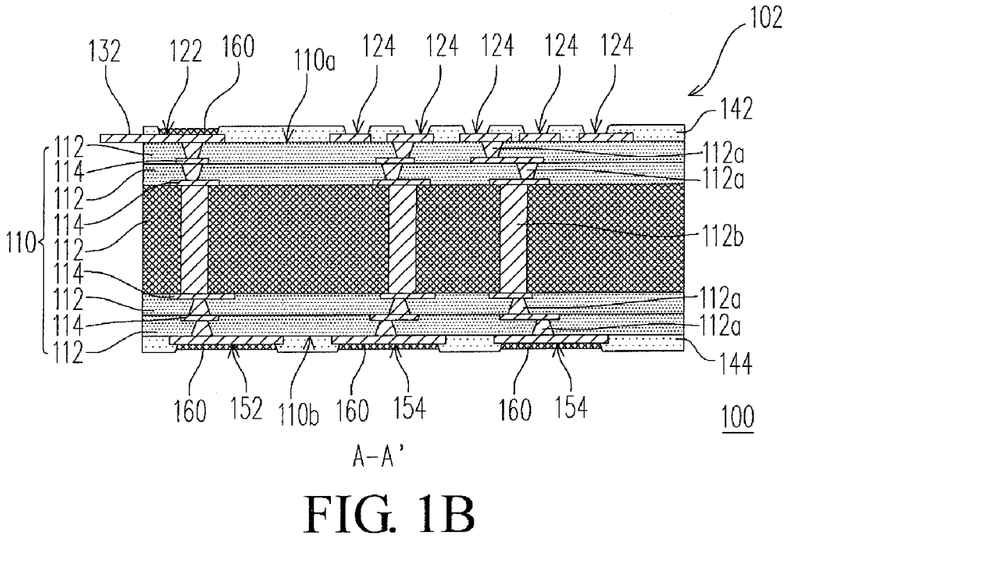

Please refer to FIG. 1A and FIG. 1B, they respectively illustrate a package substrate strip according to an embodiment of the invention and a section view thereof taken along an A-A' line. As shown in FIG. 1A and FIG. 1B, the package substrate strip 100 has at least a substrate unit 102. The substrate unit 102 includes a substrate 110, a plurality of bonding pads 124, a plurality of finger contacts 122, a plurality of plating bars 132, a reserved plating bar 134, a first patterned solder mask layer 142, a plurality of first ball pads 152, a plurality of second ball pads 154, a second patterned solder mask layer 144 and an anti-oxidation layer 160.

In this embodiment, the substrate 110 preferably comprises dielectric layers 112 and inner wiring layer 114 disposed by turn. In different layers, the inner wiring layer 114 conjuncts with conductive vias 112a and plating through hole 112b of the dielectric layer 112 to form a plurality of inner connecting structures. Moreover, the substrate 110 has a first surface 110a and an opposite second surface 110b, the bonding pads 124, the finger contacts 122 and the plating bars 132 are disposed on the first surface 110a. The finger contacts 122 are preferably disposed at a periphery area of the first surface 110a, which are suitable for electrically connecting to a chip via a wire bonding process. The bonding pads 124 are preferably arranged as a grid array at a central area of the first surface 110a, which are suitable for electrically connecting to another chip via a flip-chip bonding process. In addition, the plating bars 132 correspondingly connect with the finger contacts 122, and extend out of the substrate unit 102.

In the embodiment, for simultaneously plating the first ball pads 152 and the second ball pads 154, a reserved plating bar 134 is further formed on the first surface 110a of the substrate 110, wherein the reserved plating bar 134 preferably extends out of the substrate unit 102 from a position beside the bonding pads 124 and connects with the plating bars 132 at outside of the substrate unit 102. During a manufacture, the reserved plating bar 134 is preferably formed by a same metal layer with the bonding pads 124, the finger contacts 122 and the plating bars 132.

Please continue refer to FIG. 1A, the first patterned solder mask layer 142 is disposed on the first surface 110a of the substrate 110, and exposes the bonding pads 124, the finger contacts 122 and a part of the reserved plating bar 134 (such as a end of the reserved plating bar 134). The first ball pads 152 and the second ball pads 154 are disposed on the second surface 110b of the substrate 110, and each of them respectively electrically connects with the finger contacts 122 and the bonding pads 124 via the inner connecting structure of the substrate 110. Furthermore, the second patterned solder mask layer 144 is disposed on the second surface 110b of the substrate, and exposes the first ball pads 152 and the second ball pads 154.

In the embodiment, the reserved plating bar 134 is disposed beside the bonding pads 124, whereby to connect the bonding pads 124 and the original plating bars 132 with the plating bar 134. Therefore, the finger contacts 122, the first ball pads 152 that connects with the finger contacts 122 and the second ball pads 154 that connects with the bonding pads 124 can be simultaneously plated to form an anti-oxidation layer 160 thereon via the plating bars 132 and the reserved plating bar 134. Commonly, the anti-oxidation layer is preferably a nickel/gold layer.

Following description will further introduce said design that have a reserved plating bar. FIG. 2A to 8A sequentially illustrate the method that perform a metal surface treatment on the semi-finished package substrate strip 100 to form an anti-oxidation layer on the finger contacts 122, the first ball pads 152 and the second ball pads 154. FIG. 2B to 8B respectively illustrate the section view of the semi-finished package substrate strip taken along an A-A' line corresponding to the FIG. 2A to 8A.

Figure 2A:
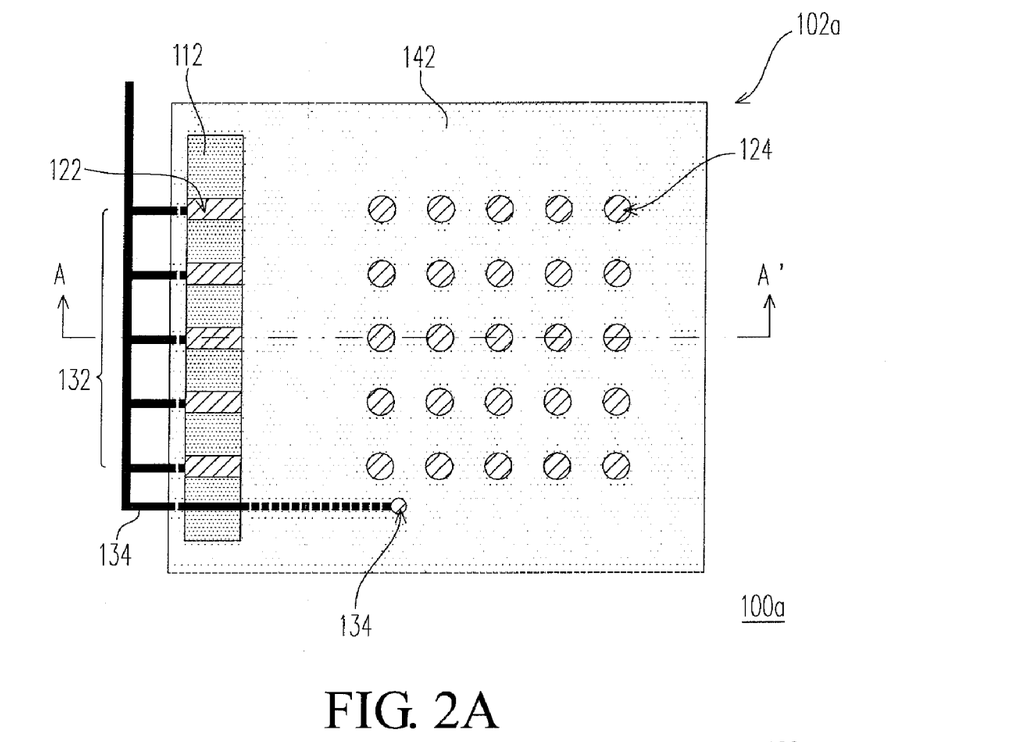
Figure 2B:
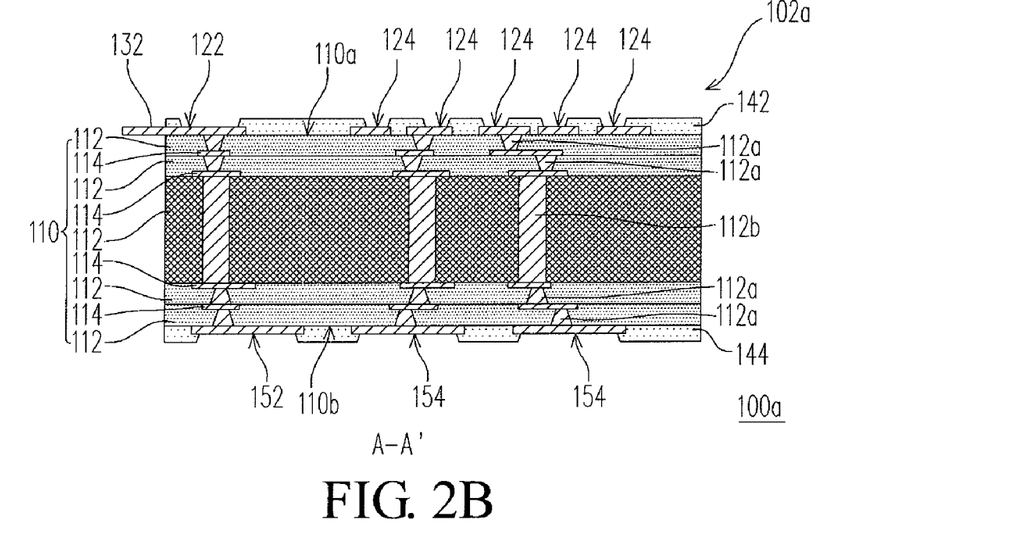

Firstly, as shown in FIG. 2A and FIG. 2B, providing a semi-finished package substrate strip 100a, the semi-finished package substrate strip 100a generally refers to a package substrate strip that haven't finish forming an anti-oxidation layer 160. In this embodiment, the semi-finished package substrate strip 100a may comprise a signal substrate unit or a plurality of substrate units disposed as a grid array. As most elements of the semi-finished package substrate strip 100a have been introduced in above description, in the following description, the introduction about said relative elements will be ignored and not repeated.

Next, as shown in FIG. 3A to 5A and FIG. 3B to 5B, forming a conductive layer 170 on a part of the first surface 110a of the substrate 110. The conductive layer 170 needs to connect the bonding pads 124 and a part of the reserved plating bar 134 exposed by the first patterned solder mask layer 142, and the conductive layer 170 needs to expose the finger contacts 122. At this time, the second ball pads 154 electrically connected with the bonding pads 124 is capable of electrically connecting with the reserved plating bar 134 via the conductive layer 170.

Figure 3A:
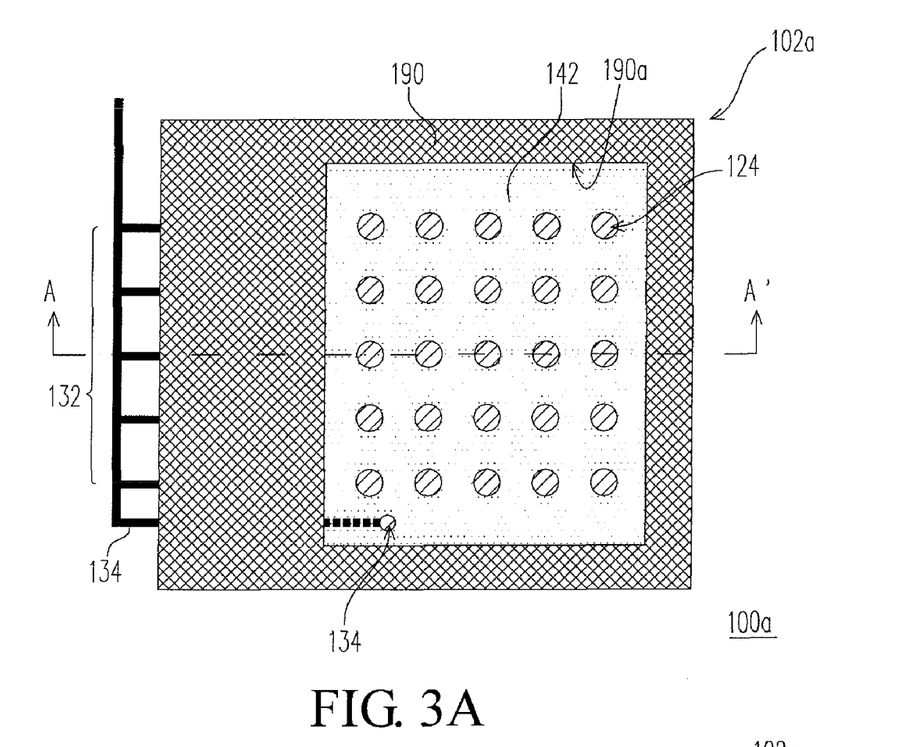
Figure 3B:
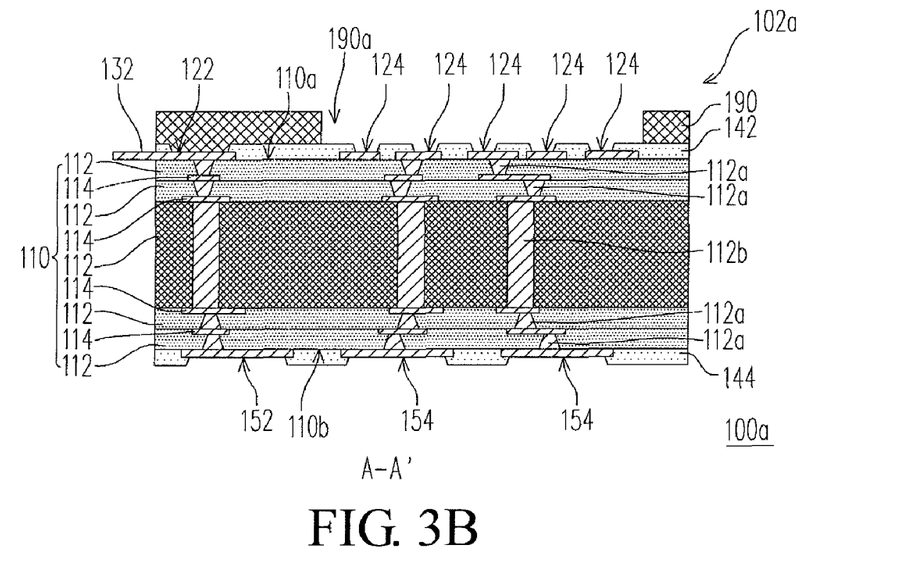
Figure 4A:
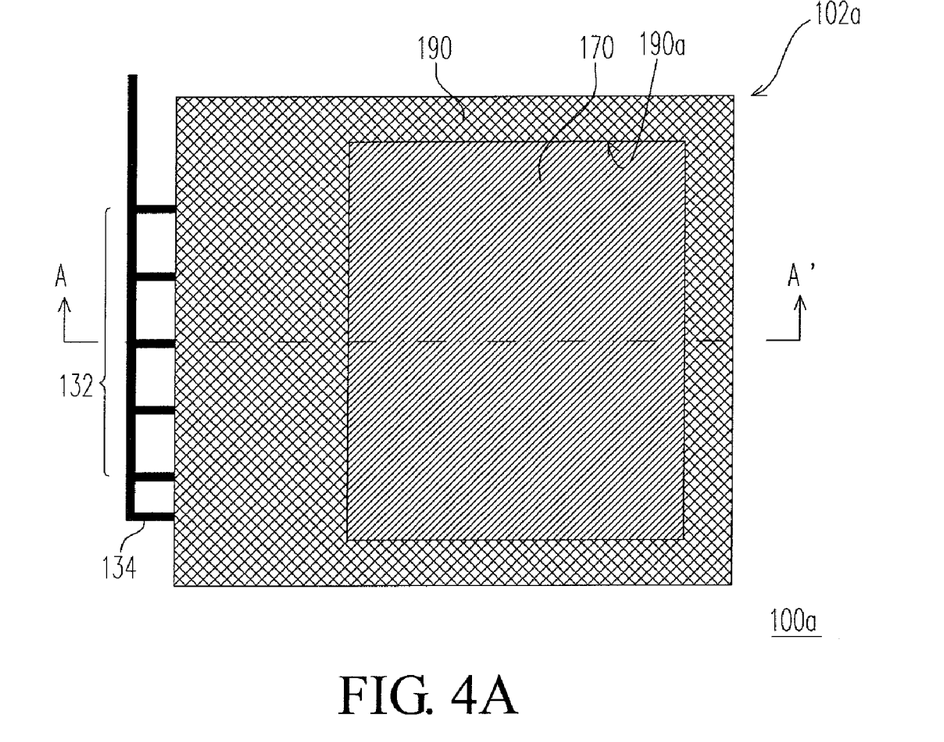
Figure 4B:
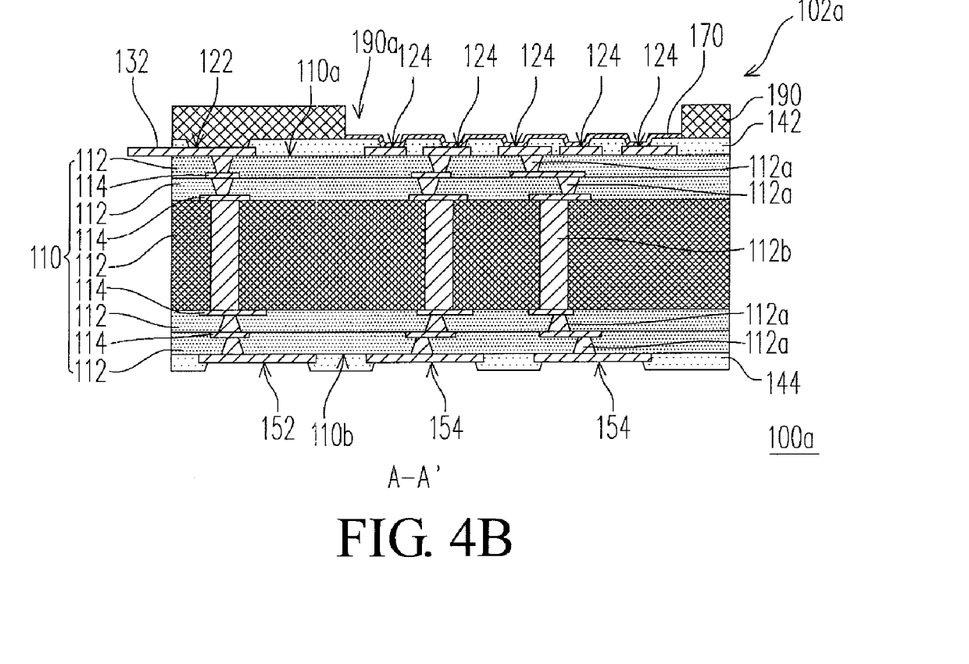
Figure 5A:
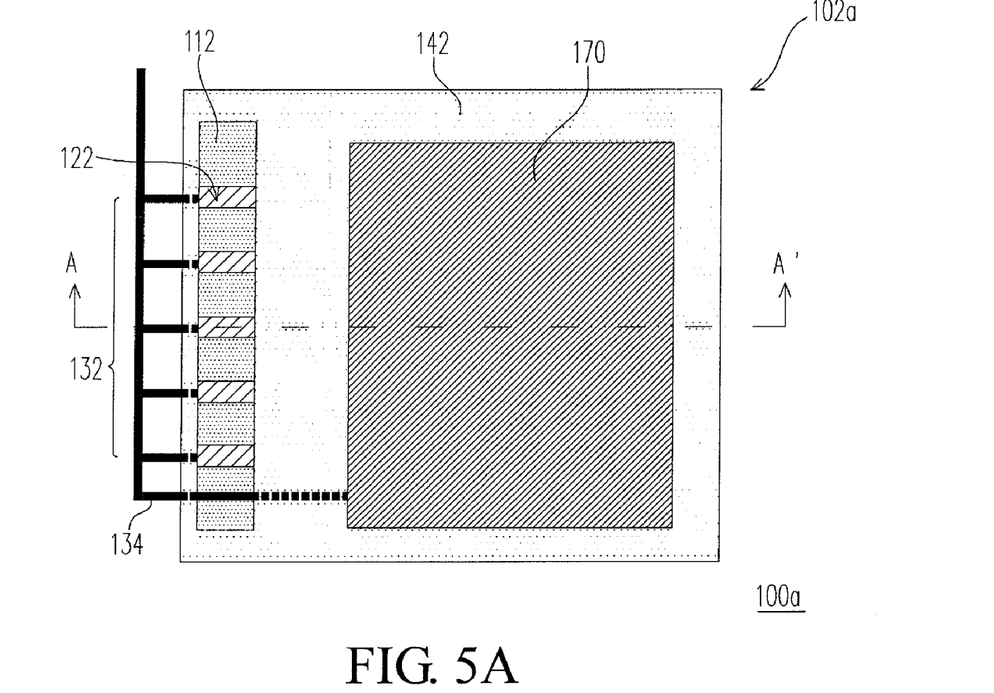
Figure 5B:
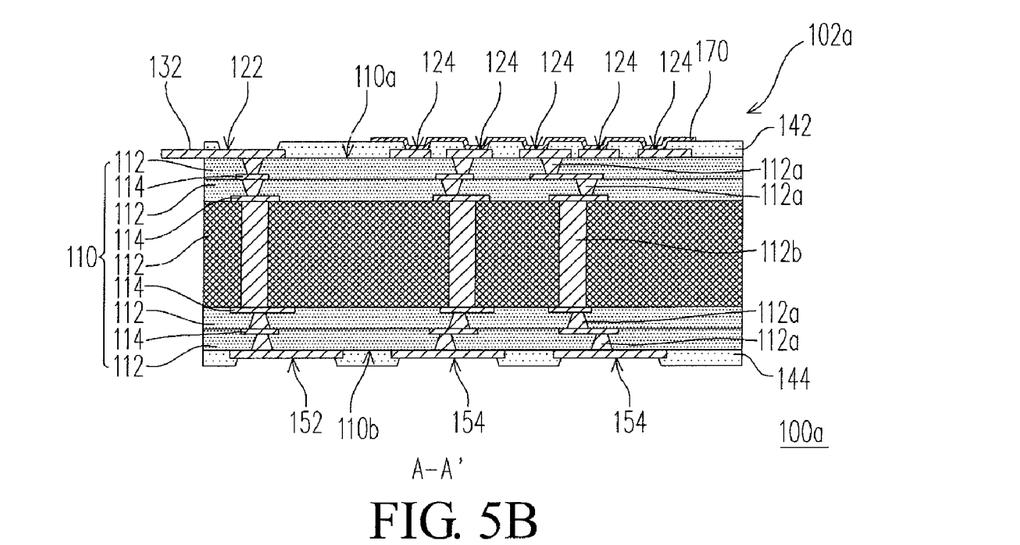

More detailed, the method of forming a conductive layer in the embodiment, as shown in the FIGS. 3A and 3B, firstly providing a mask 190 above the first surface 110a of the substrate 110, wherein, the mask 190 has an opening 190a for exposing the bonding pads 124 and a part of the reserved plating bar 134. Next, as shown in FIG. 4A and FIG. 4B, forming a conductive layer 170 in the opening 190a through a chemical plating method. Then, removing the mask 190. In the embodiment, a familiar dry film photoresist may be used as the mask 190 to form a conductive layer 170 above part area of the first surface 110a. Certainly, the embodiment does not debar any other suitable patterned manufacture process to form the conductive 170.

Figure 6A:
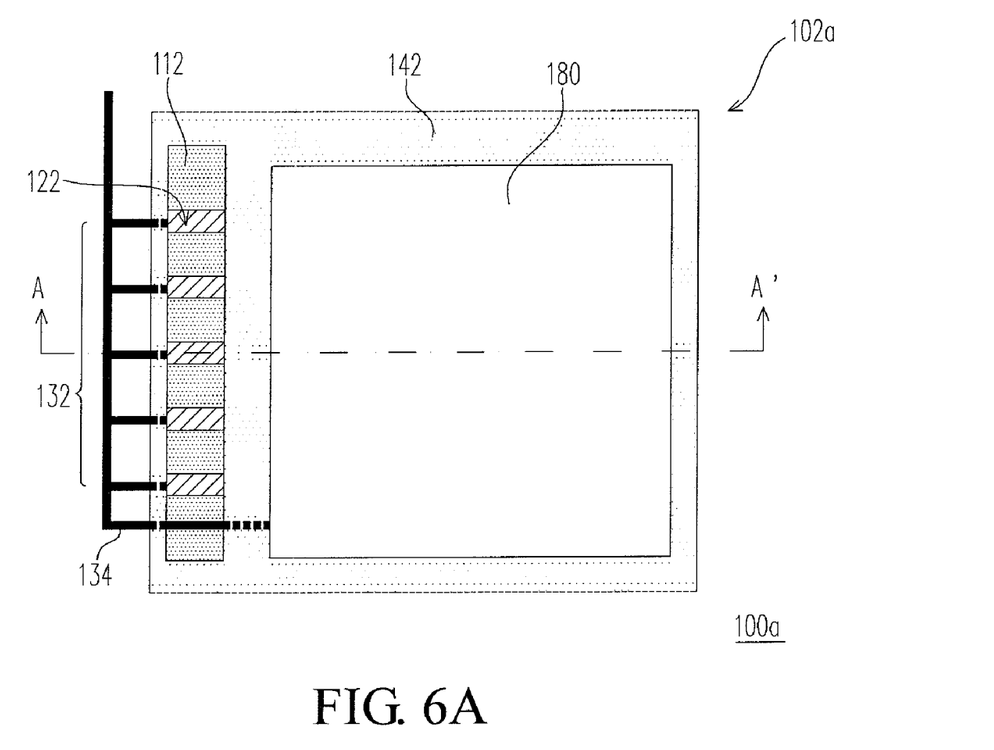
Figure 6B:
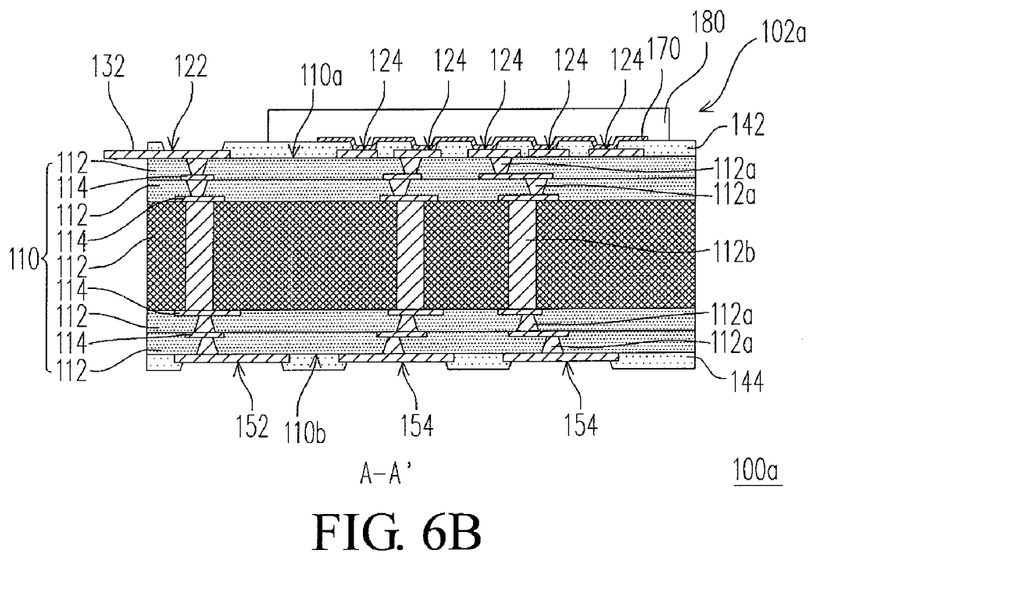

Next, as shown in FIGS. 6A and 6B, covering a isolating layer 180 on the conductive layer 170. In this step, the method for forming the isolating layer 180 is preferably directly attaching a dry film photoresist above the first surface 110a of the substrate 110. Besides this method, similar to above mentioned step, an alternative method is to primarily provide a mask (not shown) above the first surface 110a of the substrate 110, and then deposit the isolating layer 180 on the area exposed by the mask; or another alternative method is to choose to form the isolating layer 180 by publish or any other suitable method.

Figure 7A:
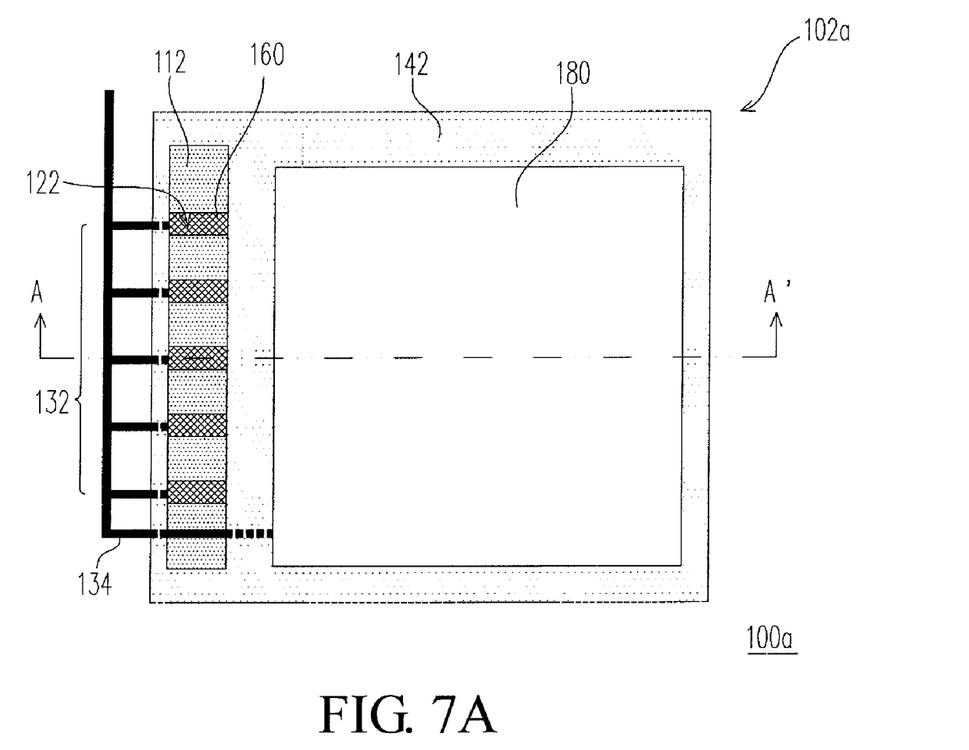
Figure 7B:
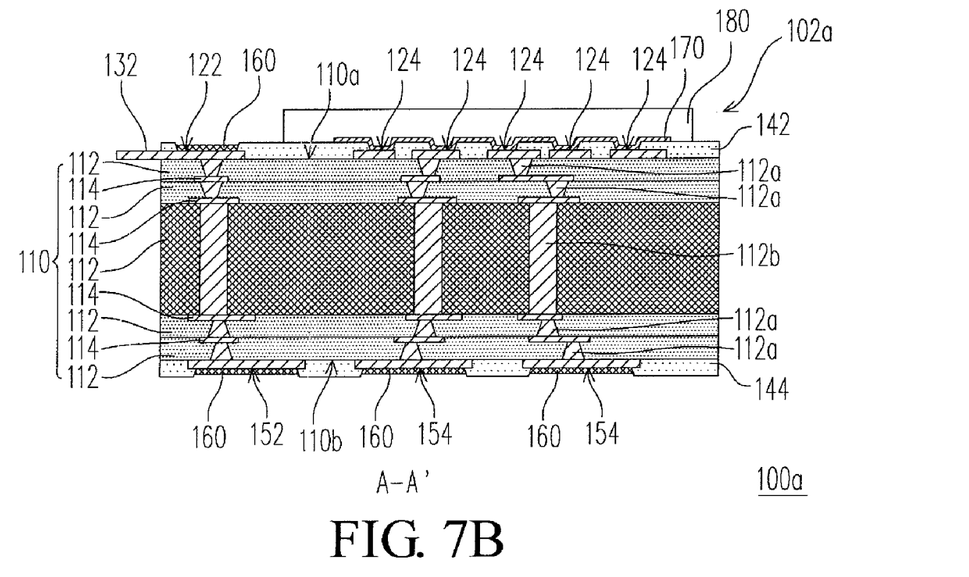

Then, as shown in FIGS. 7A and 7B, the second ball pads 154 are capable of electrically connecting with said bonding pads 124 via the inner connecting structures of the substrate 110, and capable of electrically connecting with the reserved plating bar 134 via the conductive layer 170. Thus, in this step, utilizing the plating bars 132 and the reserved plating bar 134, an anti-oxidation layer 160 can be formed on the finger contacts 122, the first ball pads 152 and the second ball pads 154 through an electrolytic plating method. It should be noted that, as the bonding pads 124 are covered by the isolating layer 180, the anti-oxidation layer 160 will not be formed on the bonding pads 124.

Figure 8A:
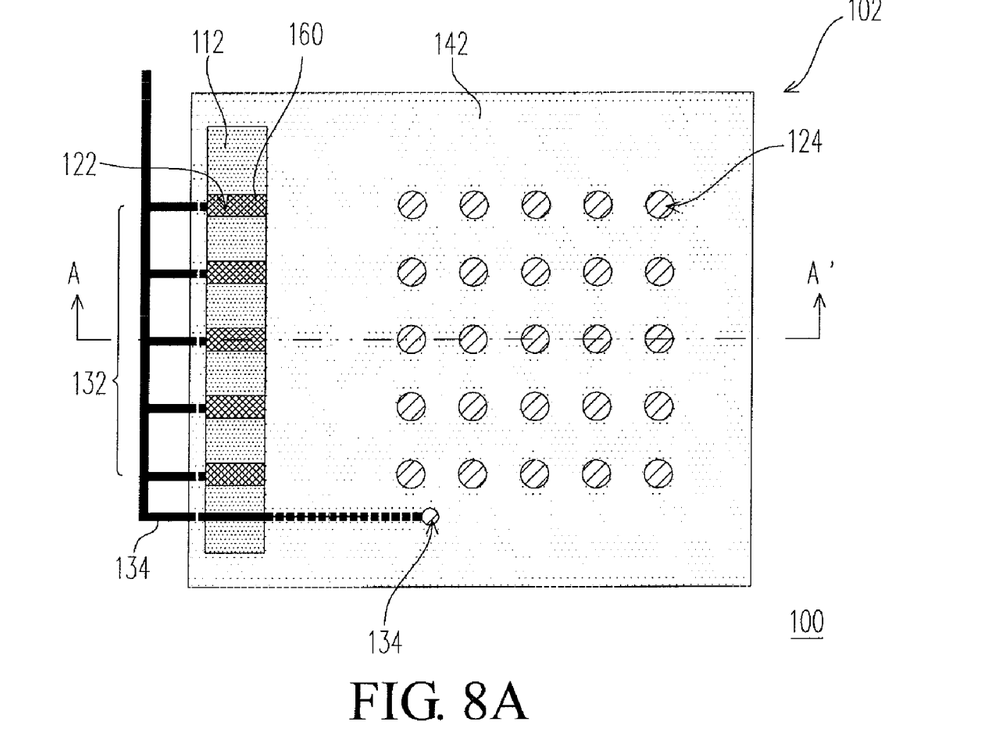
Figure 8B:
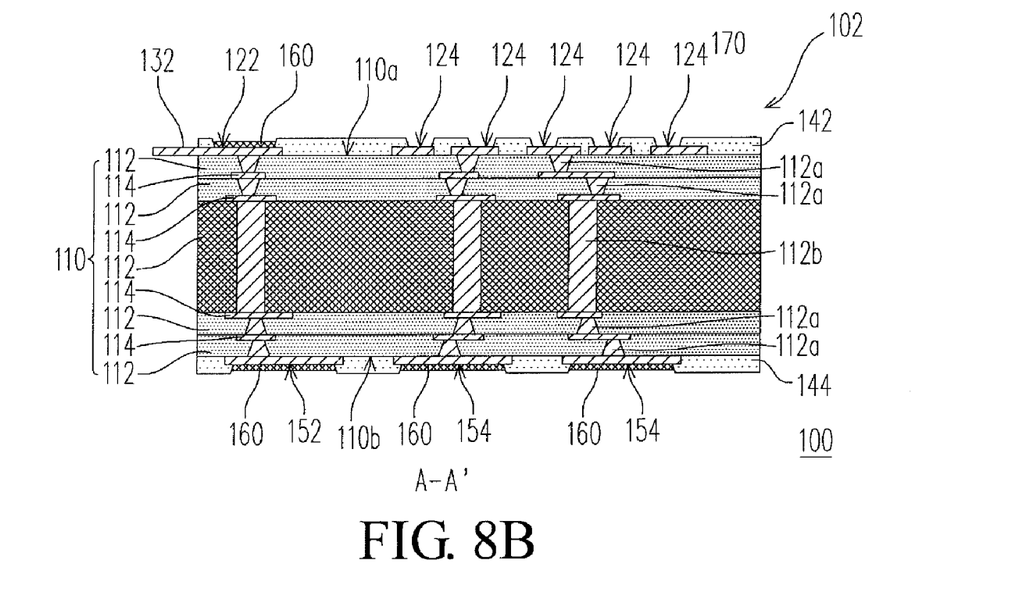

Subsequently, as shown in FIGS. 8A and 8B, remove the isolating layer 180 and the conductive layer 170, then the package substrate strip 100 is obtained.

Figure 9:
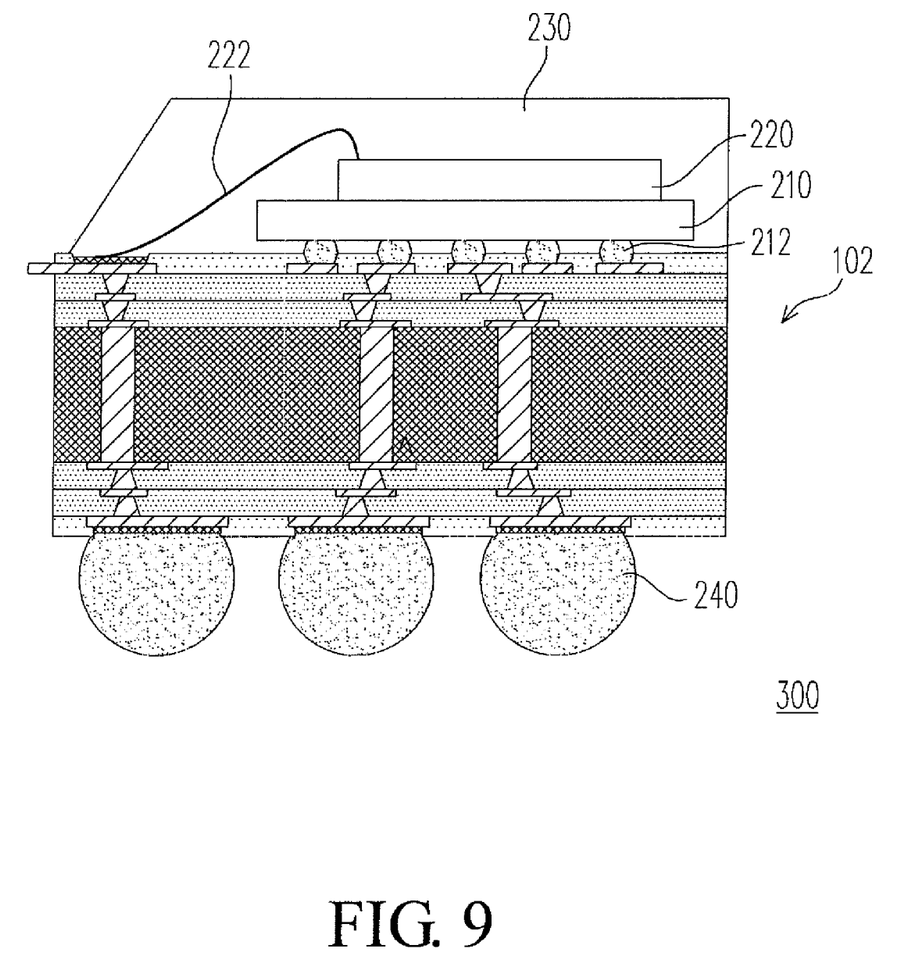
FIG. 9 illustrates a chip package structure applying the package substrate strip of the invention.

FIG. 9 further illustrates a chip package applying said package substrate strip 100. As shown in this figure, the chip package 300 is mainly manufactured by assembling said substrate unit 102 of the package substrate strip 100 with a first chip 210 and a second chip 210, then formed by a singulation process. The first chip 210 is disposed above the first surface 110a of the substrate 110, and is electrically connected with the bonding pads 124 via a plurality of conductive bumps 212 through a flip-chip bonding method. In addition, the second chip 220 is disposed on the first chip 210, and is electrically connected with the finger contacts 122 via a plurality of wires 222 through a wire bonding method. Furthermore, as the chip package 300 is formed by a formation process, the original part of the plating bars 132 that connected with the reserved plating bar 134 at outside of the substrate unit 102 will also be removed during the formation process, whereby divide each plating bars 132 and the reserved plating bar 134 into several independent parts.

Please refer to FIG. 9 again, for protecting the wire 222, the second chip 220, the finger contacts 122 and other elements disposed on the first surface 110a of the substrate 110, the chip package further includes a package encapsulant 230, which is disposed on the first patterned solder mask layer 142, and packs the first chip 210, the second chip 220, the wire 222, the finger contacts 122, the conductive bumps 212, the bonding pads 124 and otherwise elements. In addition, the first ball pads 152 and the second ball pads 154 can be disposed with a plurality of solder balls 240, for electrically connecting the chip package 300 with an external circuit.

As mentioned above, since the bonding pads and the finger contacts of a conventional hybrid substrate are not able to both connect with the plating bars, it's impossible to perform a simultaneous plating treatment on the finger contacts, the first ball pads and the second ball pads. The invention disposes a reserved plating bar on the surface of the substrate, and provides a metal surface treatment method to form a conductive layer that connecting the reserved plating bar and the bonding pads, and provides an isolating layer covering the conductive layer. Since the second ball pads are capable of connecting to the plating bars via the bonding pads, the conductive layer and the reserved plating bar, a plating treatment can be simultaneously preformed to the finger contacts, the first ball pads electrically connecting to the finger contacts and the second ball pads electrically connecting to the bonding pads by original plating bars and the reserved plating bar, so as to form an anti-oxidation layer thereon without forming any anti-oxidation layer on the surface of bonding pads. Whereby simplify manufacturing process, reduce production cost, and improve production efficiency and yield.

It is to be understood, however, that even though numerous characteristics and advantages of the present invention have been set fourth in the foregoing description, together with details of the structure and function of the invention, the disclosure is illustrative only, and changes may be made in detail within the principles of the invention to the full extent indicated by the broad general meaning of the terms in which the appended claims are expressed.

What is claimed is:

1. A package substrate strip having at least a substrate unit, the substrate unit comprising:
    a substrate having a first surface and an opposite second surface;
    a plurality of bonding pads disposed on said first surface;
    a plurality of finger contacts disposed on said first surface;
    a plurality of plating bars disposed on said first surface, wherein the plating bars connect with corresponding finger contacts and extends out of the substrate unit;
    a reserved plating bar disposed on said first surface, wherein the reserved plating bar extends out of the substrate unit from a position beside the bonding pads, and connects with the plating bars at outside of the substrate unit;
    a first patterned solder mask layer disposed on said first surface, wherein the first patterned solder mask layer exposes the bonding pads, the finger contacts and a part of the reserved plating bar;
    a plurality of first ball pads disposed on the second surface and respectively electrically connecting to the finger contacts via the substrate;
    a plurality of second ball pads disposed on the second surface and respectively electrically connecting to the bonding pads via the substrate;
    a second patterned solder mask layer disposed on the second surface and exposing said first ball pads and second ball pads; and
    an anti-oxidation layer disposed on the finger contacts, the first ball pads and the second ball pads.

2. The package substrate strip according to claim 1, wherein the anti-oxidation layer includes a nickel/gold layer.

3. The package substrate strip according to claim 1, wherein said finger contacts are wire bonding contacts.

4. The package substrate strip according to claim 1, wherein the bonding pads are flip-chip bonding pads.

5. The package substrate strip according to claim 1, wherein the finger contacts locate at a periphery area of the first surface.

6. The package substrate strip according to claim 1, wherein the bonding pads arrange as a grid array at a central area of the first surface.

7. The package substrate strip according to claim 1, wherein the substrate includes a plurality of dielectric layers and at least an inner wiring layer, wherein the inner wiring layer is disposed between two neighbor dielectric layers.

8. A chip package structure, comprising:
    a substrate having a first surface and an opposite second surface;
    a plurality of bonding pads disposed on said first surface;
    a plurality of finger contacts disposed on said first surface;
    a reserved plating bar disposed on said first surface, wherein the reserved plating bar extends outside the substrate unit from a position beside the bonding pads;
    a first patterned solder mask layer disposed on said first surface, wherein the first patterned solder mask layer exposes the bonding pads, the finger contacts and a part of the reserved plating bar;
    a plurality of first ball pads disposed on the second surface and respectively electrically connecting to the finger contacts via the substrate;
    a plurality of second ball pads disposed on the second surface and respectively electrically connecting to the bonding pads via the substrate;
    a second patterned solder mask layer disposed on the second surface and exposing said first ball pads and second ball pads; and
    an anti-oxidation layer disposed on the finger contacts, the first ball pads and the second ball pads;
    a first chip disposed on the first surface and electrically connecting to the bonding pads; and
    a second chip disposed on the first chip and electrically connecting to the finger contacts.

9. The chip package structure according to claim 8, wherein the anti-oxidation layer includes a nickel/gold layer.

10. The chip package structure according to claim 8, wherein said first chip is electrically connected to the bonding pads via a plurality of conductive bumps.

11. The chip package structure according to claim 8, wherein said second chip is electrically connected to the finger contacts via a plurality of wires.

12. The chip package structure according to claim 8, wherein the finger contacts locate at a periphery area of the first surface.

13. The chip package structure according to claim 8, wherein the bonding pads arrange as a grid array at a central area of the first surface.

14. The chip package structure according to claim 8, wherein the substrate includes a plurality of dielectric layers and at least an inner wiring layer, wherein the inner wiring layer is disposed between two neighbor dielectric layer.

15. The chip package structure according to claim 8, further comprises a plurality of solder balls disposed on the first ball pads and the second ball pads.

16. The chip package structure according to claim 8, further comprises a package encapsulant disposed on the first surface for packing the first chip, the second chip, the finger contacts and the bonding pads.

* * * * *